(12) United States Patent
King et al.

(10) Patent No.: US 10,581,322 B2
(45) Date of Patent: Mar. 3, 2020

(54) CHARGE PUMP INPUT CURRENT LIMITER

(71) Applicant: Cirrus Logic International Semiconductor Ltd., Edinburgh (GB)

(72) Inventors: Eric J. King, Austin, TX (US); Aaron J. Brennan, Austin, TX (US); Christian Larsen, Austin, TX (US); John L. Melanson, Austin, TX (US); Yongjie Cheng, Austin, TX (US); Adrian Colli-Menchi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/783,506

(22) Filed: Oct. 13, 2017

(65) Prior Publication Data

US 2018/0109181 A1 Apr. 19, 2018

Related U.S. Application Data

(60) Provisional application No. 62/408,418, filed on Oct. 14, 2016, provisional application No. 62/457,506, filed on Feb. 10, 2017.

(51) Int. Cl.
*H02M 3/07* (2006.01)
*H03F 1/02* (2006.01)
(Continued)

(52) U.S. Cl.
CPC ............. *H02M 3/07* (2013.01); *H02M 1/32* (2013.01); *H03F 1/0211* (2013.01); *H03F 3/187* (2013.01);
(Continued)

(58) Field of Classification Search
CPC .. H02M 3/07; H02M 3/073; H02M 2003/072; H02M 3/075; H02M 3/076; H02M 3/077
See application file for complete search history.

(56) References Cited

U.S. PATENT DOCUMENTS 5,889,427 A * 3/1999 Nakajima ............. H02M 3/073
327/313
5,973,944 A * 10/1999 Nork ....................... H02M 1/44
307/110
(Continued)

FOREIGN PATENT DOCUMENTS

WO 2008074666 A1 6/2008

OTHER PUBLICATIONS

International Search Report and Written Opinion of the International Searching Authority, International Application No. PCT/US2017/056590, dated Jan. 22, 2018.

*Primary Examiner* — Thomas J. Hiltunen
(74) *Attorney, Agent, or Firm* — Jackson Walker L.L.P.

(57) ABSTRACT

A system may include a charge pump configured to operate in a plurality of modes including a first mode in which the ratio of an output voltage to an input voltage of the charge pump is a first ratio and a second mode in which the ratio is a second ratio and a controller configured to limit current flowing between a power source of the charge pump to the charge pump, wherein the power source provides the input voltage, by limiting a transfer of charge between the power source and the charge pump during a switching cycle of the charge pump responsive to a change in operation between modes of the plurality of modes.

22 Claims, 6 Drawing Sheets

(51) Int. Cl.
   *H03F 3/213*   (2006.01)
   *H02M 1/32*    (2007.01)
   *H03F 3/187*   (2006.01)
   *H02M 1/00*        (2006.01)
   *H03M 1/66*        (2006.01)
   *H03F 3/21*        (2006.01)

(52) U.S. Cl.
   CPC ..... *H03F 3/213* (2013.01); *H02M 2001/0045* (2013.01); *H03F 3/21* (2013.01); *H03F 2200/03* (2013.01); *H03M 1/66* (2013.01)

(56) References Cited

U.S. PATENT DOCUMENTS

| | | | | |
|---|---|---|---|---|
| 6,226,193 B1* | 5/2001 | Bayer | .................... | H02M 3/07 363/59 |
| 6,438,005 B1 | 8/2002 | Walter | | |
| 6,445,623 B1 | 9/2002 | Zhang et al. | | |
| 6,504,422 B1* | 1/2003 | Rader | .................... | H02M 3/07 327/536 |
| 6,937,487 B1* | 8/2005 | Bron | .................... | H02M 3/073 323/266 |
| 6,995,995 B2 | 2/2006 | Zeng | .................... | H02M 3/07 327/536 |
| 7,208,997 B2 | 4/2007 | Sohara | | |
| 7,990,205 B2 | 8/2011 | Jung | | |
| 8,013,664 B2* | 9/2011 | Gerber | .................... | H02M 3/07 327/536 |
| 8,193,853 B2* | 6/2012 | Hsieh | .................... | H02M 3/07 327/536 |
| 8,264,273 B2* | 9/2012 | MacFarlane | ............ | H02M 3/07 327/536 |
| 8,610,492 B2* | 12/2013 | Prabhu | .................... | H02M 3/07 327/534 |
| 8,729,816 B1* | 5/2014 | Genest | ............... | H05B 33/0809 315/209 R |
| 9,172,300 B2* | 10/2015 | Li | .......................... | H02M 3/07 |
| 9,225,234 B2* | 12/2015 | Ku | .......................... | H02M 1/36 |
| 9,264,053 B2* | 2/2016 | Englekirk | ............. | H03L 7/0891 |
| 9,819,260 B2* | 11/2017 | Hissink | ................... | H03F 1/523 |
| 9,847,712 B2* | 12/2017 | Low | .................... | H02M 3/073 |
| 2003/0085752 A1 | 5/2003 | Rader et al. | | |
| 2005/0219878 A1* | 10/2005 | Ito | .......................... | H02M 3/07 363/59 |
| 2007/0024347 A1* | 2/2007 | Nagasawa | ............... | H02M 1/36 327/536 |
| 2007/0146051 A1* | 6/2007 | Tsen | ....................... | H02M 3/07 327/536 |
| 2007/0211502 A1* | 9/2007 | Komiya | ................... | H02M 3/07 363/59 |
| 2007/0279021 A1* | 12/2007 | Yanagida | ................ | H02M 3/07 323/272 |
| 2008/0030261 A1* | 2/2008 | Nakata | ................... | H02M 3/07 327/536 |
| 2010/0013548 A1* | 1/2010 | Barrow | ................... | H02M 1/36 327/536 |
| 2010/0277225 A1* | 11/2010 | Gerber | ................... | H02M 3/07 327/536 |

\* cited by examiner

US 10,581,322 B2

CHARGE PUMP INPUT CURRENT LIMITER

CROSS-REFERENCES AND RELATED APPLICATION

The present disclosure claims benefit of U.S. Provisional Patent Application Ser. No. 62/408,418, filed Oct. 14, 2016 and U.S. Provisional Patent Application Ser. No. 62/457,506, filed Feb. 10, 2017, which are both incorporated by reference herein in their entirety.

FIELD OF DISCLOSURE

The present disclosure relates in general to charge pump power supplies, including without limitation personal audio devices such as wireless telephones and media players, and more specifically, to systems and methods for predictively limiting input current delivered to a charge pump.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a changeable power supply voltage to such a power amplifier, a charge pump power supply may be used, for example such as that disclosed in U.S. Pat. No. 8,311,243, in which an indication of the signal level at the output of the circuit is used to control the power supply voltage in a Class-G topology. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode.

In a typical charge pump power supply, a charge pump may operate in accordance with two non-overlapping clock phases of a switching cycle of the charge pump, with different combinations of connections among an input power source to the charge pump (e.g., a battery), a flyback capacitor of the charge pump for storing charge, and an output load capacitor which provides the power supply voltage generated by the charge pump. However, one disadvantage of a charge pump is that when switching between output voltage modes of the charge pump, an average voltage on the flyback capacitor in one mode of operation may not be equal to the output voltage required for another mode of operation. If the average voltage on the flyback capacitor is higher than the previous mode of operation, the charge pump may need to source a large inrush current from its power source (e.g., a battery). On the other hand, if the average voltage on the flyback capacitor is lower than the previous mode of operation, the charge pump may need to sink large current to its power source. Because of the sizes of capacitors often used in charge pumps, the amount of current that a charge pump may source or sink when switching between modes may not be able to be absorbed by the power source to the charge pump, which may lead to system damage. Accordingly, methods and systems for limiting such switching currents are desirable.

SUMMARY

In accordance with the teachings of the present disclosure, certain disadvantages and problems associated with performance of charge pumps have been reduced or eliminated.

In accordance with embodiments of the present disclosure, a method may include, in a charge pump configured to operate in a plurality of modes including a first mode in which the ratio of an output voltage to an input voltage of the charge pump is a first ratio and a second mode in which the ratio is a second ratio, limiting current flowing between a power source of the charge pump to the charge pump, wherein the power source provides the input voltage, by limiting a transfer of charge between the power source and the charge pump during a switching cycle of the charge pump responsive to a change in operation between modes of the plurality of modes.

In accordance with these and other embodiments of the present disclosure, a system may include a charge pump configured to operate in a plurality of modes including a first mode in which the ratio of an output voltage to an input voltage of the charge pump is a first ratio and a second mode in which the ratio is a second ratio and a controller configured to limit current flowing between a power source of the charge pump to the charge pump, wherein the power source provides the input voltage, by limiting a transfer of charge between the power source and the charge pump during a switching cycle of the charge pump responsive to a change in operation between modes of the plurality of modes.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
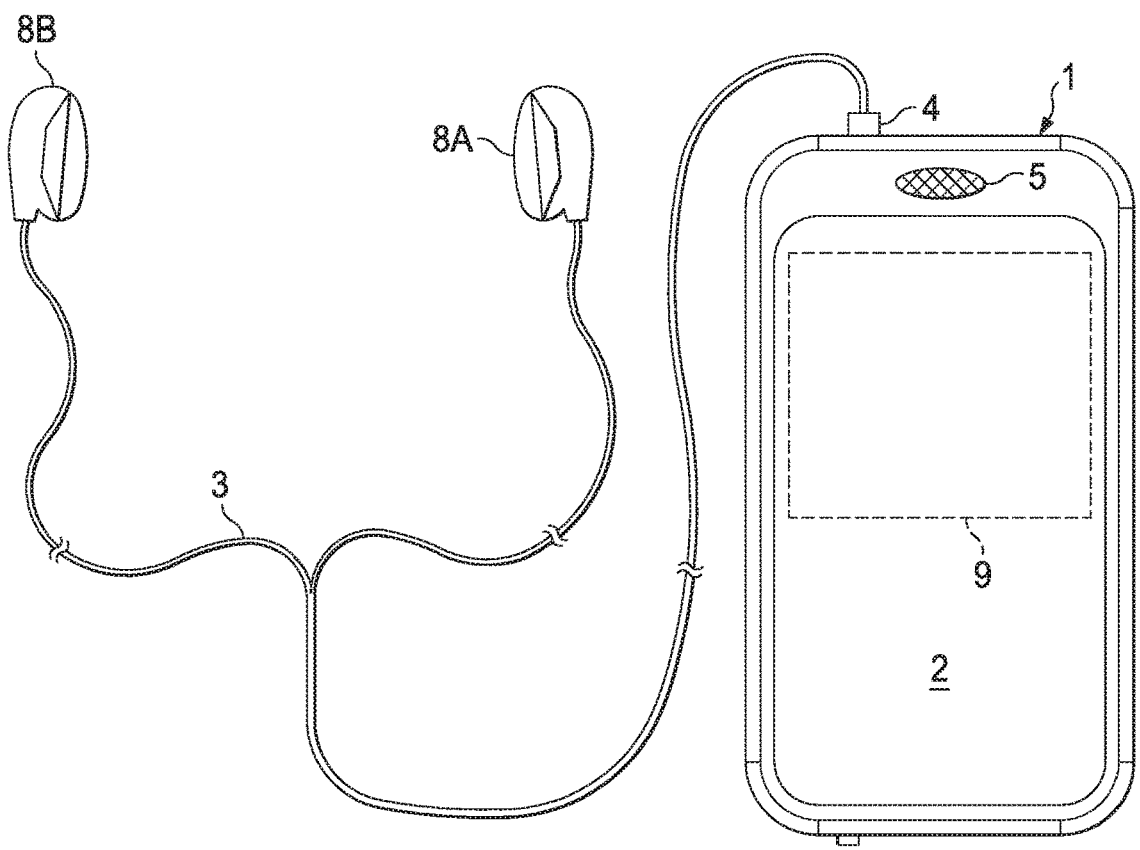
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device 1 for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
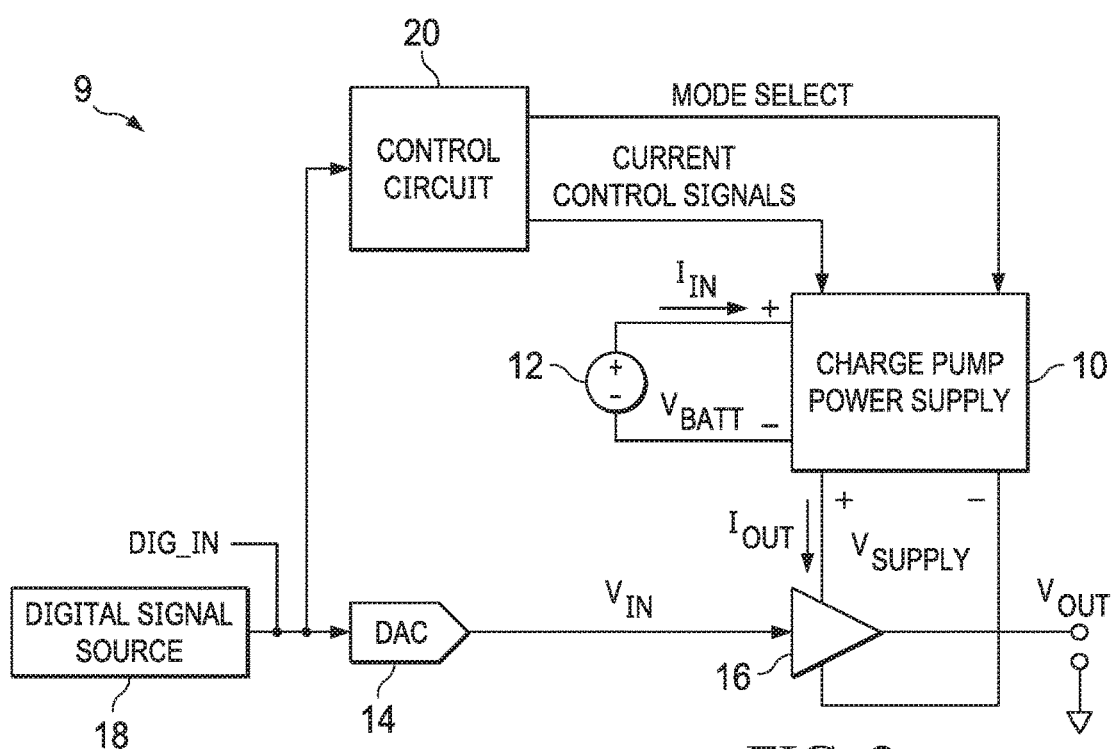
FIG. 2 is a block diagram of selected components of an example integrated circuit, which may be implemented as an audio integrated circuit of the personal audio device depicted in FIG. 1 or any other suitable device, in accordance with embodiments of the present disclosure.

FIG. 2 is a block diagram of selected components of an example IC 9, which may be implemented as audio IC 9 of personal audio device 1 or any other suitable device, in accordance with embodiments of the present disclosure. As shown in FIG. 2, a digital signal source 18 (e.g., a processor, digital signal processor, microcontroller, test equipment, or other suitable digital signal source) may supply a digital input signal DIG_IN to a digital-to-analog converter (DAC) 14, which may in turn convert digital input signal DIG_IN into an equivalent analog input signal $V_{IN}$ and communicate analog input signal $V_{IN}$ to a power amplifier stage 16 which may amplify or attenuate the analog input signal $V_{IN}$ and provide an output signal $V_{OUT}$, which, in embodiments in which digital input signal DIG_IN, analog input signal $V_{IN}$, and output signal $V_{OUT}$ are audio signals, may operate a speaker, headphone transducer, and/or a line level signal output. However, application of IC 9 as depicted in FIG. 2 may not be limited to audio applications. In addition, although amplifier stage 16 is depicted as a single-ended output generating a single-ended audio output signal $V_{OUT}$, in some embodiments, amplifier stage 16 may comprise a differential output, and may thus provide a differential audio output signal $V_{OUT}$.

A charge pump power supply 10 may provide the power supply rail inputs of a supply voltage $V_{SUPPLY}$ to amplifier 16 and may receive a power source input, generally from a battery 12 or other power supply, which may provide an input voltage $V_{BATT}$ to charge pump power supply 10. A control circuit 20 may supply a mode select signal to charge pump power supply 10 that selects an operating mode of charge pump power supply 10 so as to adjust supply voltage $V_{SUPPLY}$ generated by charge pump power supply 10 according to expected and/or actual signal levels at the output of amplifier 16. When low signal levels exist and/or are expected at amplifier output $V_{OUT}$, mode control circuit 20 may improve the power efficiency of audio IC 9 by varying the supply voltage $V_{SUPPLY}$ in conformity with the output signal $V_{OUT}$ or a signal (e.g., digital input signal DIG_IN) indicative of the output signal $V_{OUT}$. Accordingly, to maintain power efficiency, at any given time control circuit 20 may select an operating mode from a plurality of operating modes in each operating mode operating charge pump power supply 10 at a different supply voltage, $V_{SUPPLY}$, wherein the supply voltage $V_{SUPPLY}$ in one operational mode is a rational multiple or ratio of supply voltages of other operational modes.

Figure 3:
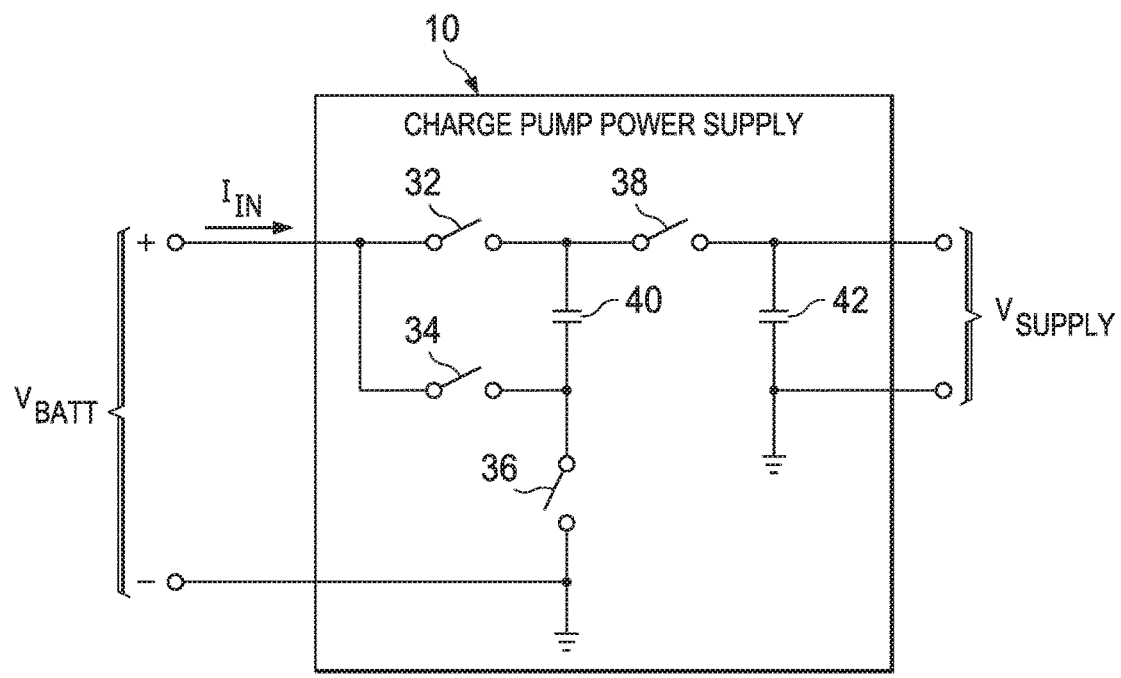
FIG. 3 is a block diagram of selected components of an example charge pump power supply, in accordance with embodiments of the present disclosure.

FIG. 3 is a block diagram of selected components of an example charge pump power supply 10, in accordance with embodiments of the present disclosure. Charge pump power supply 10 as shown in FIG. 3 may be configured to operate in two modes: a first mode in which the supply voltage $V_{SUPPLY}$ output by charge pump power supply 10 is equal to input voltage $V_{BATT}$, and a second mode in which the supply voltage $V_{SUPPLY}$ output by charge pump power supply 10 is equal to two times input voltage $V_{BATT}$. As shown in FIG. 3, charge pump power supply 10 may include switches 32, 34, 36, and 38, a flying capacitor 40, and a charge pump output capacitor 42.

Each switch 32, 34, 36, and 38 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 32, 34, 36, and 38 are not depicted although such control signals would be present to selectively enable and disable switches 32, 34, 36, and 38. In some embodiments, a switch 32, 34, 36, and 38 may comprise an n-type metal-oxide-semiconductor field-effect transistor. In these and other embodiments, a switch 32, 34, 36, and 38 may comprise a p-type metal-oxide-semiconductor field-effect transistor. Switch 32 may be coupled between a positive input terminal of charge pump power supply 10 and a first terminal of flying capacitor 40. Switch 34 may be coupled between the positive input terminal of charge pump power supply 10 and a second terminal of flying capacitor 40. Switch 36 may be coupled between a negative input terminal of charge pump power supply 10 and a second terminal of flying capacitor 40. Switch 38 may be coupled between the first terminal of flying capacitor 40 and a first terminal of charge pump output capacitor 42.

Flying capacitor 40 and charge pump output capacitor 42 may each comprise a passive two-terminal electrical component used to store energy electrostatically in an electric field, which may generate a current in response to a time-varying voltage across the capacitor (or vice versa). Charge pump output capacitor 42 may be coupled between the output terminals of charge pump power supply 10, and thus may store supply voltage $V_{SUPPLY}$ output by charge pump power supply 10.

In the first mode, charge pump power supply 10 may operate in a single phase, wherein switch 34 may be disabled and switches 32, 36, and 38 may be enabled during operation, thus charging voltage $V_{SUPPLY}$ on charge pump output capacitor 42 to input voltage $V_{BATT}$. In the second mode, charge pump power supply 10 may sequentially operate in a charging phase in which switches 32 and 36 are enabled and switches 34 and 38 are disabled, allowing charge transfer from battery 12 to flying capacitor 40, and a transfer phase in which switches 32 and 36 are disabled and switches 34 and 38 are enabled, boosting the voltage on flying capacitor 40 and allowing charge transfer from flying capacitor 40 to charge pump output capacitor 42.

Although FIG. 3 depicts a particular implementation of a charge pump power supply 10 configured to switch between a first mode in which the boost ratio of supply voltage $V_{SUPPLY}$ and input voltage $V_{BATT}$ is 1, and a second mode in which the boost ratio of supply voltage $V_{SUPPLY}$ and input voltage $V_{BATT}$ is 2, the systems and methods herein may generally apply to charge pump power supplies having more than two modes of operation and/or boost ratios other than 1 or 2 (e.g., 1.5, 3, etc.). In addition, although FIG. 3 depicts a particular implementation of a charge pump power supply 10 having switches 32-38, a single flying capacitor 40, and a charge pump output capacitor 42, the systems and methods herein may generally apply to charge pump power supplies having any suitable topology of switches, one or more flyback capacitors, and one or more load capacitors.

As shown in FIGS. 2 and 3, battery 12 may supply a current $i_{in}$ to charge pump power supply 10, and charge pump power supply 10 may generate a current $i_{out}$ to amplifier 16. As mentioned in the Background section of this application, it may be advantageous to limit the magnitude of the current $i_{in}$ sourced from or sunk to battery 12 by charge pump power supply 10. Thus, in accordance with methods and systems of the present disclosure, control circuit 20 may also be configured to generate current control signals as shown in FIG. 2 to limit input current $i_{in}$, as described in greater detail below.

Input current $i_{in}$ may be limited by limiting a change in voltage allowed on a capacitor (e.g., flying capacitor 40) during a switching phase of charge pump power supply 10, as given by the well-known relationship between current and voltage in a capacitor:

$$i = C\frac{\Delta v}{\Delta t}$$

Where $\Delta v$ is the change in capacitor voltage over the time period $\Delta t$, C is the capacitor, and i is the current. If the capacitor voltage is not allowed to change outside the time interval $\Delta t$ within a total switching period T (e.g., a switching period includes all switching phases) of charge pump power supply 10, the average current $i_{avg}$ may be given as:

$$i_{avg} = C\frac{\Delta v}{T} = C\frac{\Delta Q}{T}$$

where $\Delta Q$ is the change in capacitor charge over switching period T. The equation above suggests two ways to control average current $i_{avg}$: (1) limit the maximum change in voltage $\Delta v$ applied to the capacitor in switching period T, and (2) limit an amount of time a capacitor is allowed to charge in a switching period.

One approach to limiting a maximum change in voltage $\Delta v$ applied to a capacitor in a switching period T is to, when switching between operation modes of charge pump power supply 10, insert a voltage drop in series with the power source (e.g., battery 12) and capacitor (e.g., flying capacitor 40). Such a voltage drop may be implemented in numerous ways, including a variable resistor, a variable conductance switch, a low dropout regulator, a variable voltage source, and/or a current limiter.

Figure 4:
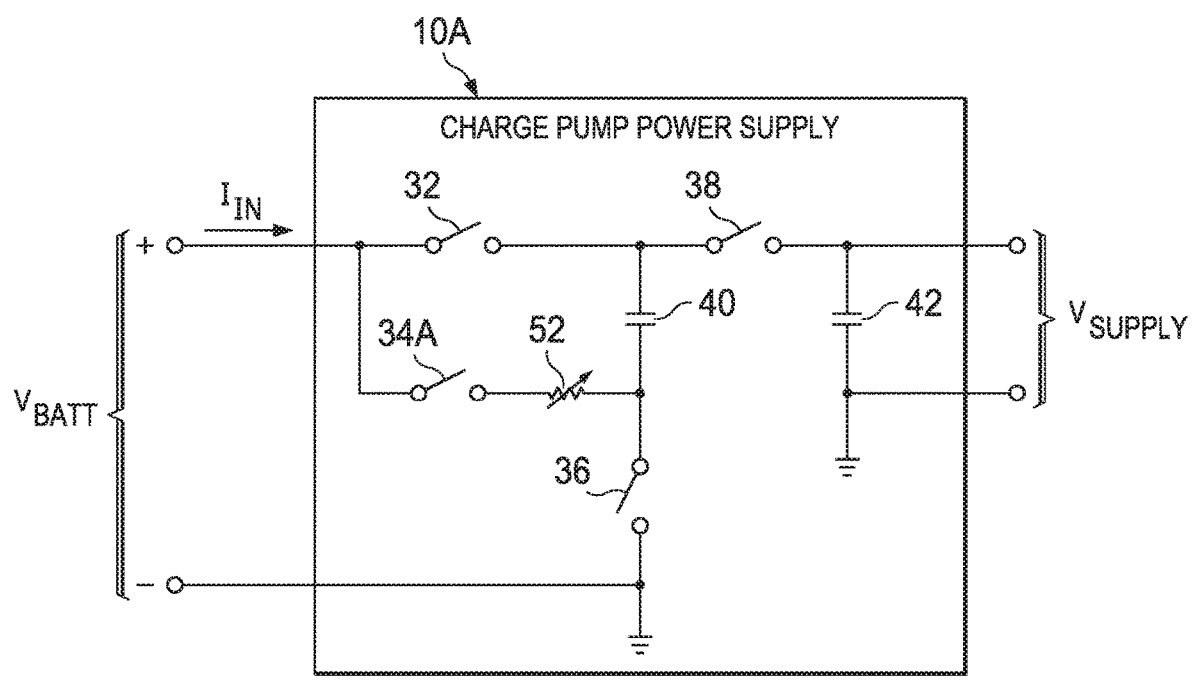
FIG. 4 is a block diagram of selected components of a charge pump power supply with current-limiting circuitry implemented with a variable resistor, in accordance with embodiments of the present disclosure.

FIG. 4 is a block diagram of selected components of a charge pump power supply 10A with current-limiting circuitry implemented with a variable resistor, in accordance with embodiments of the present disclosure. Charge pump power supply 10A of FIG. 4 may be similar in many respects to charge pump power supply 10 of FIG. 3, except that switch 34A and variable resistor 52 in series with switch 34A are placed in lieu of switch 34. Although a particular switch of charge pump power supply 10 has been replaced with a series switch and resistor combination in charge pump power supply 10A, any suitable switch of charge pump power supply 10 may be replaced in such manner in order to appropriately limit current.

In operation, during a switch in modes from the first mode to the second mode, variable resistor 52 may initially have a sufficiently large resistance to set an appropriate limit in the change in voltage across flying capacitor 40 and thus limit charge transferred to the bottom plate of flying capacitor 40 during a switching cycle of charge pump power supply 10A when switch 34A is enabled. The resistance of variable resistor 52 may be reduced in successive switching cycles of charge pump power supply 10A, until charge pump power supply 10A reaches steady state operation in the second mode, at which point variable resistor 52 may be set to have an approximately zero resistance.

Figure 5:
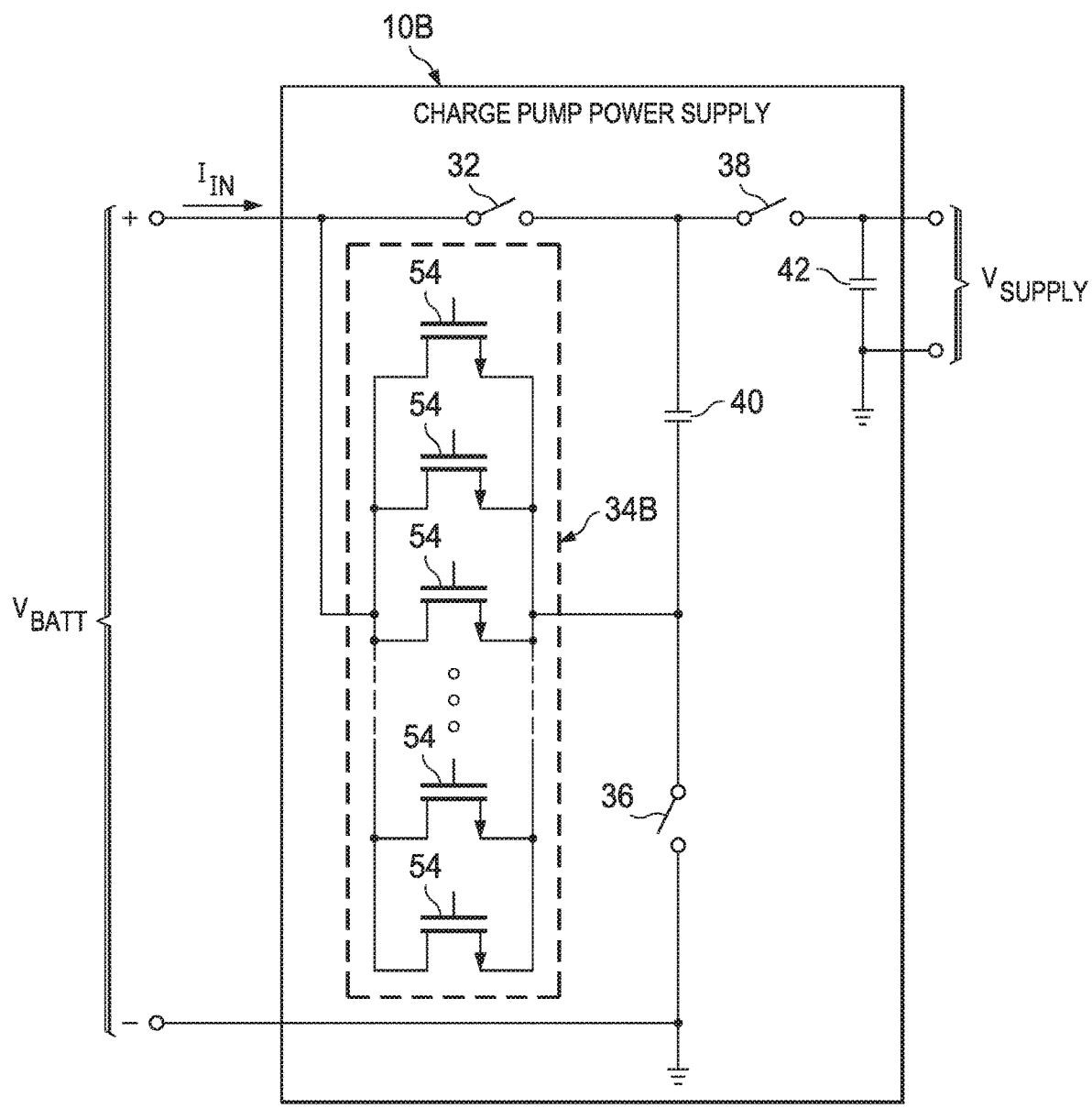
FIG. 5 is a block diagram of selected components of a charge pump power supply with current-limiting circuitry implemented with a variable-conductance switch, in accordance with embodiments of the present disclosure.

FIG. 5 is a block diagram of selected components of a charge pump power supply 10B with current-limiting circuitry implemented with a variable-conductance switch, in accordance with embodiments of the present disclosure. Charge pump power supply 10B of FIG. 5 may be similar in many respects to charge pump power supply 10 of FIG. 3, except that switch 34B is placed in lieu of switch 34, wherein switch 34B is implemented with a series of switching elements 54. Switching elements 54 are shown as n-type metal-oxide-semiconductor field-effect transistors (MOSFETs) in FIG. 5, but may be implemented by any suitable switching element, including a p-type MOSFET. Although a particular switch of charge pump power supply 10 has been replaced with a variable-conductance switch in charge pump power supply 10B, any suitable switch of charge pump power supply 10 may be replaced in such manner in order to appropriately limit current.

In operation, during a switch in modes from the first mode to the second mode, initially switch 34B may be enabled with a sufficiently large resistance by enabling only a portion of switching elements 54 to set an appropriate limit in the change in voltage across flying capacitor 40 and thus limit charge transferred to the bottom plate of flying capacitor 40 during a switching cycle of charge pump power supply 10B when switch 34B is enabled. The resistance of switch 34B may be reduced in successive switching cycles of charge pump power supply 10B, by enabling an additional amount of switching elements 54 until charge pump power supply 10B reaches steady state operation in the second mode, at which point all switching elements 54 may be enabled. Thus, using such approach, initially when switching operation from the first mode to the second mode, only a portion of the effective device width of switch 34B may be enabled, after which, in successive switching cycles of charge pump power supply 10B, additional portions of the effective device width of switch 34B are enabled.

Figure 6:
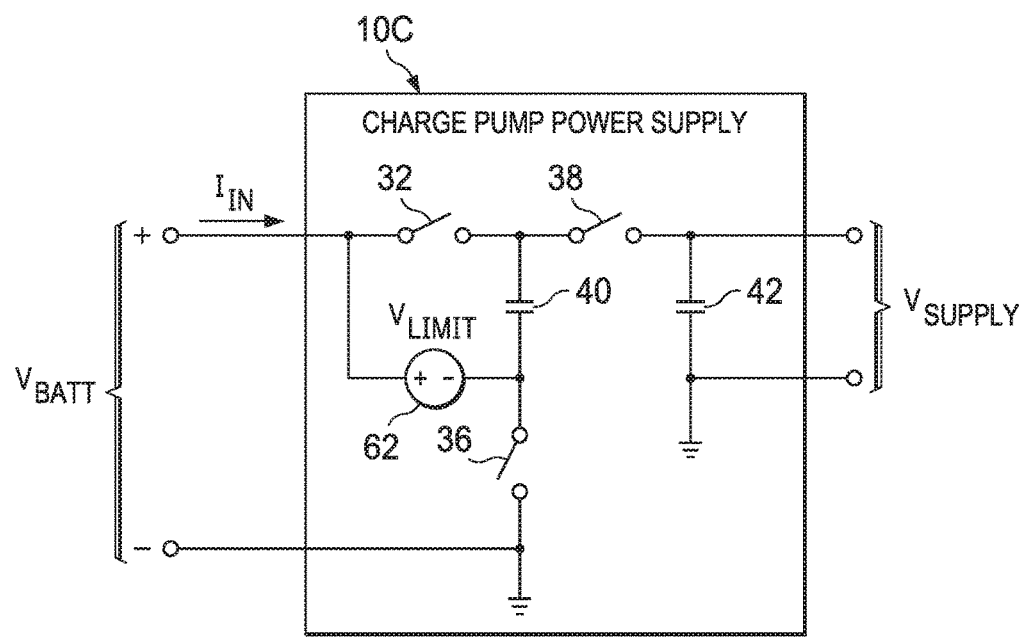
FIG. 6 is a block diagram of selected components of a charge pump power supply with current-limiting circuitry implemented with a variable voltage source, in accordance with embodiments of the present disclosure.

FIG. 6 is a block diagram of selected components of a charge pump power supply 10C with current-limiting circuitry implemented with a variable voltage source, in accordance with embodiments of the present disclosure. Charge pump power supply 10C of FIG. 6 may be similar in many respects to charge pump power supply 10 of FIG. 3, except that variable voltage source 62 is placed in lieu of switch 34. Although a particular switch of charge pump power supply 10 has been replaced with variable voltage source 62 in charge pump power supply 10C, any suitable switch of charge pump power supply 10 may be replaced in such manner in order to appropriately limit current. In addition, the embodiments shown in FIGS. 4, 5, 7, and 8 may in many respects be considered equivalent from an operational standpoint to FIG. 6, as variable voltage source 62 may be implemented with the series switch and resistor combination of FIG. 4, the variable-conductance switch of FIG. 5, the transistor and low dropout regulator combination of FIG. 7, and/or the source follower of FIG. 8.

In operation, during a switch in modes from the first mode to the second mode, voltage $V_{LIMIT}$ of variable voltage source 62 may be set to a particular set point voltage so as to limit the change in voltage across flying capacitor 40 and thus limit charge transferred to the bottom plate of flying capacitor 40 during a switching cycle of charge pump power supply 10C. The voltage $V_{LIMIT}$ of variable voltage source 62 may be modified in successive switching cycles of charge pump power supply 10C until charge pump power supply 10C reaches steady state operation in the second mode.

Figure 7:
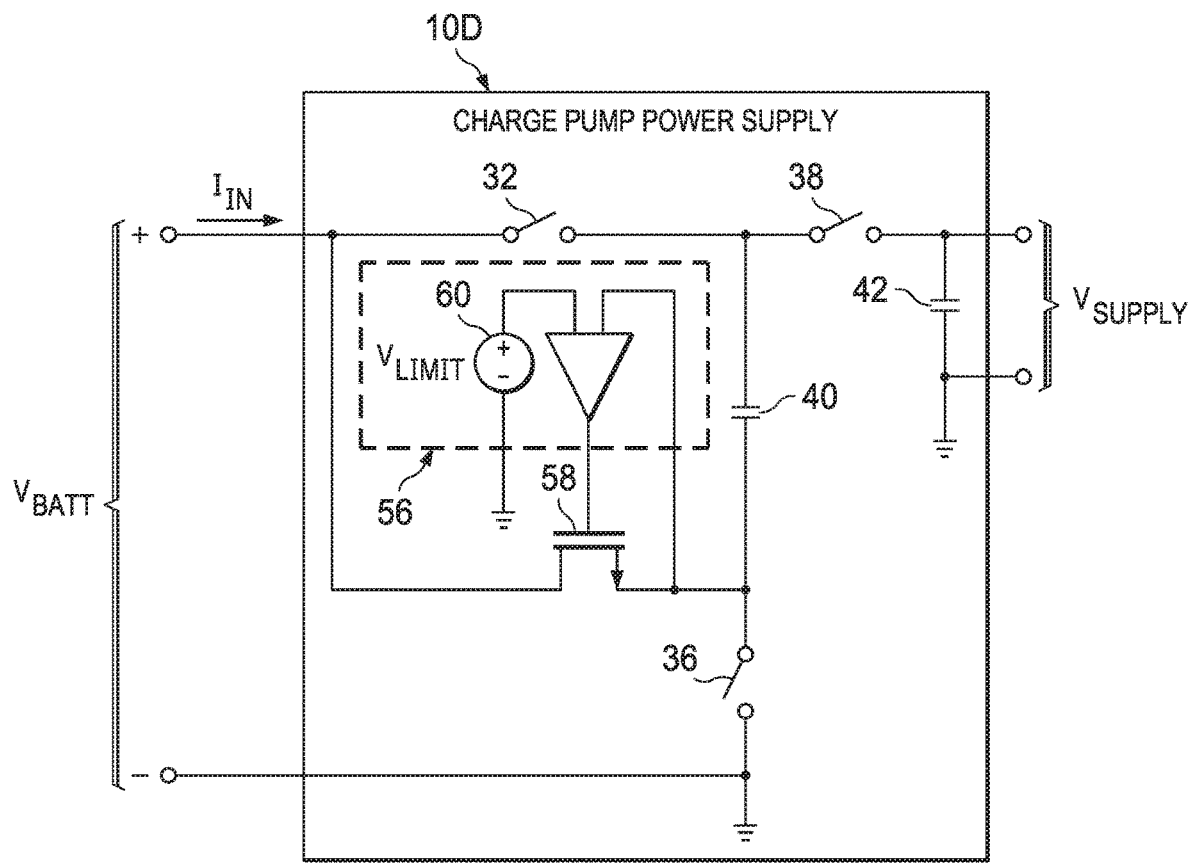
FIG. 7 is a block diagram of selected components of a charge pump power supply with current-limiting circuitry implemented with a low dropout regulator, in accordance with embodiments of the present disclosure.

FIG. 7 is a block diagram of selected components of a charge pump power supply 10D with current-limiting circuitry implemented with a low dropout regulator, in accordance with embodiments of the present disclosure. Charge pump power supply 10D of FIG. 7 may be similar in many respects to charge pump power supply 10 of FIG. 3, except that n-type MOSFET 58 is placed in lieu of switch 34, and a gate of switch 58 is controlled by low dropout regulator 56 having an operational amplifier and variable voltage source 60 arranged as shown. Although n-type MOSFET 58 is shown in FIG. 7 in lieu of switch 34 of FIG. 3, any suitable switching device, including a p-type MOSFET, may be used. Also, although a particular switch of charge pump power supply 10 has been replaced with n-type MOSFET 58 and low dropout regulator 56 in charge pump power supply 10D, any suitable switch of charge pump power supply 10 may be replaced in such manner in order to appropriately limit current.

In operation, during a switch in modes from the first mode to the second mode, voltage $V_{LIMIT}$ of variable voltage source 60 may be set to a particular set point voltage so as to limit the change in voltage across flying capacitor 40 and thus limit charge transferred to the bottom plate of flying capacitor 40 during a switching cycle of charge pump power supply 10D. The voltage $V_{LIMIT}$ of variable voltage source 60 may be modified in successive switching cycles of charge pump power supply 10D until charge pump power supply 10D reaches steady state operation in the second mode.

Figure 8:
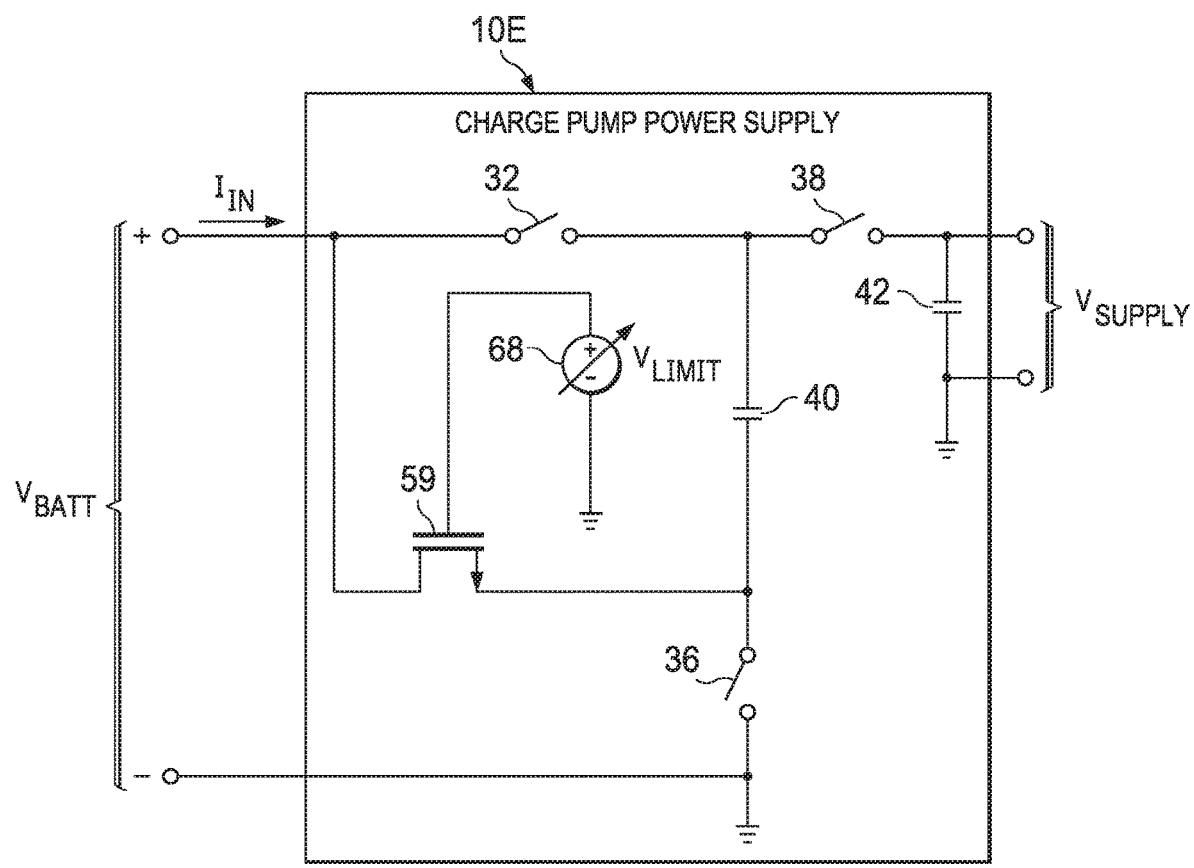
FIG. 8 is a block diagram of selected components of a charge pump power supply with current-limiting circuitry implemented with a source follower, in accordance with embodiments of the present disclosure.

FIG. 8 is a block diagram of selected components of a charge pump power supply 10E with current-limiting circuitry implemented with a source follower, in accordance with embodiments of the present disclosure. Charge pump power supply 10E of FIG. 8 may be similar in many respects to charge pump power supply 10 of FIG. 3, except that n-type MOSFET 59 is placed in lieu of switch 34, and a gate of switch 59 is controlled by variable voltage source 68 having a variable voltage limit $V_{LIMIT}$. Although n-type MOSFET 59 is shown in FIG. 8 in lieu of switch 34 of FIG. 3, any suitable switching device, including a p-type MOSFET, may be used. Also, although a particular switch of charge pump power supply 10 has been replaced with n-type MOSFET 59 and variable voltage source 68 in charge pump power supply 10E, any suitable switch of charge pump power supply 10 may be replaced in such manner in order to appropriately limit current.

In operation, during a switch in modes from the first mode to the second mode, voltage limit $V_{LIMIT}$ of variable voltage source 68, and n-type MOSFET 59 may operate as a source follower wherein the source voltage of such source follower may be equal to voltage limit $V_{LIMIT}$ minus a threshold voltage of n-type MOSFET 59. Thus, variable voltage limit $V_{LIMIT}$ may be set to a particular set point voltage so as to limit the change in voltage across flying capacitor 40 and thus limit charge transferred to the bottom plate of flying capacitor 40 during a switching cycle of charge pump power supply 10E. The voltage $V_{LIMIT}$ of variable voltage source 68 may be modified in successive switching cycles of charge pump power supply 10E until charge pump power supply 10E reaches steady state operation in the second mode.

In the various charge pump power supplies shown in FIGS. 4-8, current is controlled by, responsive to a change in operational modes of a charge pump power supply from a first mode to a second mode, immediately increasing a resistance within the charge pump power supply during a first switching cycle of the charge pump power supply in the second operational mode, followed by decreasing such resistance in subsequent switching cycles of the charge pump power supply until steady state operation in the second operational mode is reached (at which point the value of such resistance may be equal to the value of such resistance prior to switching from the first mode to the second mode). In some embodiments, such resistance may vary with a voltage associated with the charge pump power supply, such as a voltage associated with a capacitor.

Figure 9:
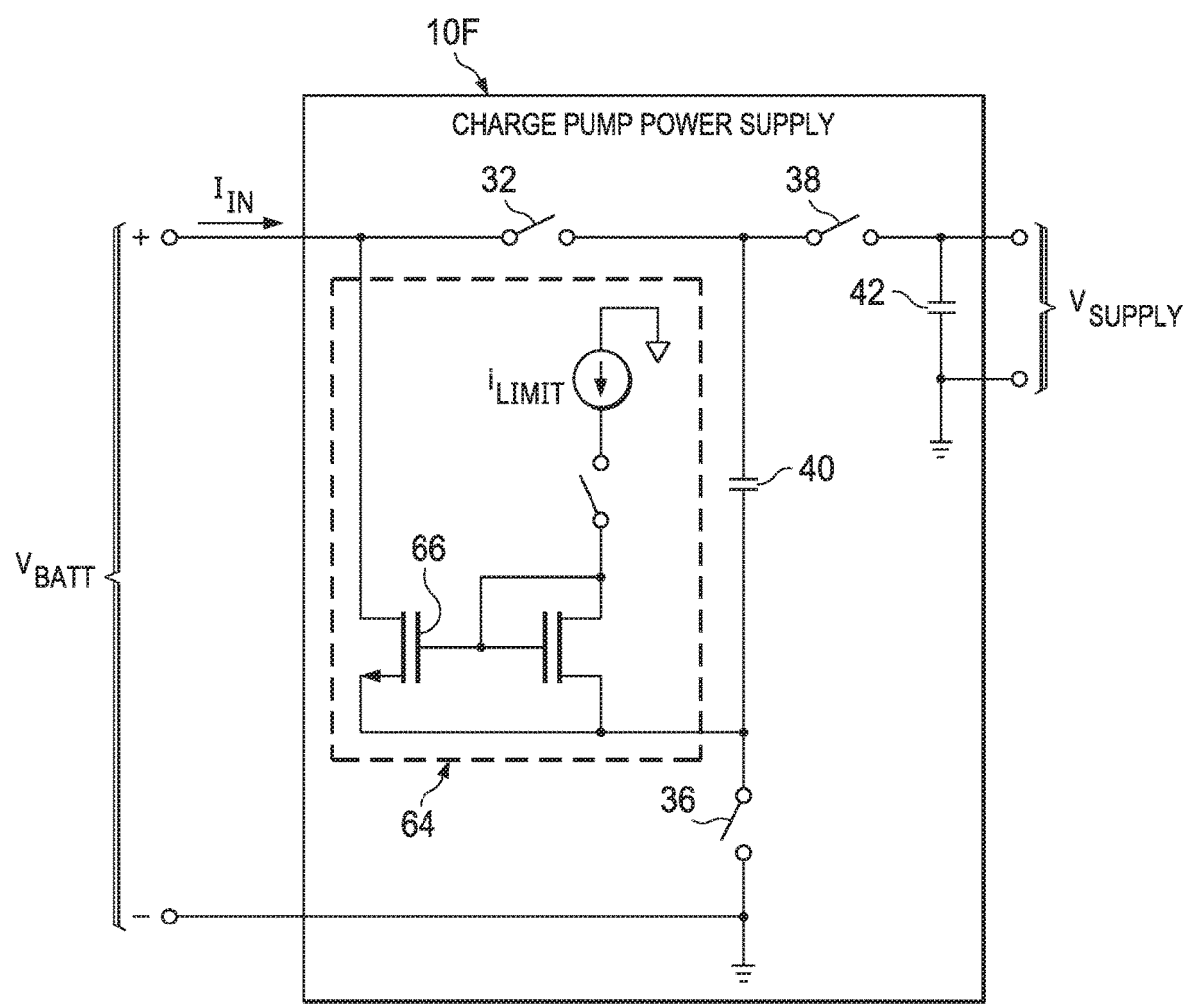
FIG. 9 is a block diagram of selected components of a charge pump power supply with current-limiting circuitry implemented with a current mirror, in accordance with embodiments of the present disclosure.

FIG. 9 is a block diagram of selected components of a charge pump power supply 10F with current-limiting circuitry implemented with a current mirror, in accordance with embodiments of the present disclosure. Charge pump power supply 10F of FIG. 9 may be similar in many respects to charge pump power supply 10 of FIG. 3, except that current mirror 64 is placed in lieu of switch 34. Although a particular switch of charge pump power supply 10 has been replaced with current mirror 64 in charge pump power supply 10F, any suitable switch of charge pump power supply 10 may be replaced in such manner in order to appropriately limit current.

In operation, during a switch in modes from the first mode to the second mode, current $i_{LIMIT}$ of current mirror 64 may be set to a particular set point current so as to limit input current $i_{in}$ during a charging phase in the second mode of charge pump power supply 10F. Thus, using the approach depicted in FIG. 9, current is limited by applying a bias voltage to a gate of a switch (e.g., n-type MOSFET 66) integral to charge pump power supply 10F, thus controlling a voltage bias of such switch and causing such switch to operate and be controlled as a current source.

Figure 10:
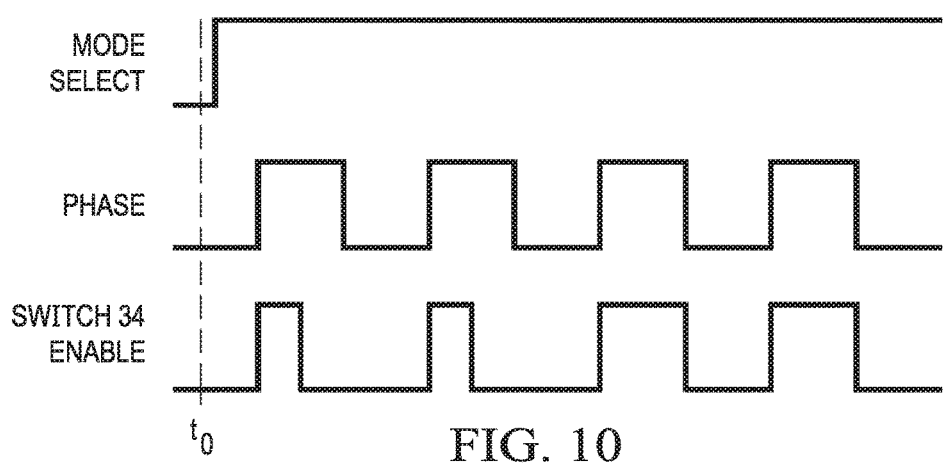
FIG. 10 is an example timing diagram of various control signals with a charge pump power supply with current-limiting circuitry implemented by controlling a duration of charge transfer, in accordance with embodiments of the present disclosure.

Although the foregoing discussion has contemplated current control by limiting a change in voltage during a switching period of a charge pump power supply, in some embodiments, a control circuit 20 may limit current by controlling an amount of time during a switching period that charge is transferred to a capacitor. For example, FIG. 10 illustrates timing diagrams associated with charge pump power supply 10, in accordance with embodiments of the present disclosure. As shown in FIG. 10, at a time $t_0$, charge pump power supply 10 may switch from the first mode of operation to the second mode of operation, as shown by the waveform MODE SELECT. Accordingly, in the charging phase of charge pump power supply 10, control circuit 20 may issue appropriate control signals such that, responsive to the change in mode, switch 34 may be enabled during only a portion of the charging phase, with such portion of time increasing in subsequent cycles of charge pump power supply 10 until switch 34 is enabled for the duration of the charging phase. In some embodiments, control of switch 34 (or another appropriate switch within any suitable charge pump power supply) may be in an open loop manner. In other embodiments, such control may be in a closed loop manner, such that the portion of a switching cycle in which a switch is enabled to transfer charge is dependent upon a voltage within charge pump power supply 10 (e.g., a voltage associated with flying capacitor 40).

Although the foregoing contemplates various approaches to limiting current using a variable impedance, it is understood that techniques analogous to those set forth herein may be employed with any suitable controllable current limiting device, including without limitation an impedance, a fast Fourier transform device (e.g., which may be equivalent to a variable impedance, especially if running in a current mirror as a function of the voltage in each cycle), or any other suitable device.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method comprising, in a charge pump configured to operate in a plurality of modes including a first mode in which a ratio of an output voltage to an input voltage of the charge pump is a first ratio and a second mode in which the ratio is a second ratio:
    limiting current flowing between a power source of the charge pump to the charge pump, wherein the power source provides the input voltage, by limiting a transfer of charge between the power source and the charge pump during a switching cycle of the charge pump responsive to a change in operation between modes of the plurality of modes, wherein:
    the charge pump comprises a capacitor, a first electrical path including a first switch between an input of the charge pump for receiving the input voltage and a first terminal of the capacitor, and a second electrical path between the input and a second terminal of the capacitor; and
    limiting the transfer of charge comprises providing a voltage drop via an impedance within the second electrical path, wherein the impedance comprises a conduction impedance between non-gate terminals of a field-effect transistor, and wherein limiting the transfer of charge comprises controlling the conduction impedance with a low dropout regulator coupled to a gate terminal of the field-effect transistor, wherein the low dropout regulator comprises at least one switch of the charge pump, and wherein the field-effect transistor is connected within only the second electrical path.

2. The method of claim 1, further comprising increasing the impedance responsive to the change in operation between modes during a switching cycle of the charge pump occurring after the change in operation.

3. The method of claim 2, further comprising reducing the impedance in subsequent switching cycles of the charge pump.

4. The method of claim 1, further comprising varying the impedance dependent upon a voltage associated with the charge pump.

5. The method of claim 4, wherein the voltage associated with the charge pump comprises a voltage of the capacitor.

6. The method of claim 1, further comprising modifying a set point of the low dropout regulator over a plurality of switching cycles of the charge pump responsive to the change in operation in order to obtain a steady state condition of the charge pump.

7. The method of claim 1, wherein limiting the transfer of charge comprises controlling the conduction impedance by controlling an effective device width of the field-effect transistor.

8. The method of claim 1, wherein the impedance comprises a switch in series with a resistor.

9. The method of claim 1, wherein limiting the transfer of charge comprises controlling a variable voltage source to control the transfer of charge.

10. The method of claim 1, wherein limiting the transfer of charge comprises applying a bias voltage to a switch integral to the charge pump, the switch having a bias control that causes the switch to operate and be controlled as a current source.

11. The method of claim 10, further comprising generating the bias voltage from a current mirror.

12. A system comprising:
a charge pump configured to operate in a plurality of modes including a first mode in which a ratio of an output voltage to an input voltage of the charge pump is a first ratio and a second mode in which the ratio is a second ratio, wherein the charge pump comprises a capacitor, a first electrical path including a first switch between an input of the charge pump for receiving the input voltage and a first terminal of the capacitor, and a second electrical path between the input and a second terminal of the capacitor; and
a controller configured to;
limit current flowing between a power source of the charge pump to the charge pump, wherein the power source is configured to provide the input voltage, by limiting a transfer of charge between the power source and the charge pump during a switching cycle of the charge pump responsive to a change in operation between modes of the plurality of modes, wherein limiting the transfer of charge comprises providing a voltage drop via an impedance within the second electrical path, wherein the impedance comprises a conduction impedance between non-gate terminals of a field-effect transistor, and wherein limiting the transfer of charge comprises controlling the conduction impedance with a low dropout regulator coupled to a gate terminal of the field-effect transistor, wherein the low dropout regulator comprises at least one switch of the charge pump, and wherein the field-effect transistor is connected within only the second electrical path.

13. The system of claim 12, wherein the controller is further configured to increase the impedance responsive to the change in operation between modes during a switching cycle of the charge pump occurring after the change in operation.

14. The system of claim 13, wherein the controller is further configured to reduce the impedance in subsequent switching cycles of the charge pump.

15. The system of claim 12, further comprising varying the impedance dependent upon a voltage associated with the charge pump.

16. The system of claim 15, wherein the voltage comprises a voltage of the capacitor.

17. The system of claim 12, further comprising modifying a set point of the low dropout regulator over a plurality of switching cycles of the charge pump responsive to the change in operation in order to obtain a steady state condition of the charge pump.

18. The system of claim 12, wherein limiting the transfer of charge comprises controlling the conduction impedance by controlling an effective device width of the field-effect transistor.

19. The system of claim 12, wherein the impedance comprises a switch in series with a resistor.

20. The system of claim 12, wherein limiting the transfer of charge comprises controlling a variable voltage source to control the transfer of charge.

21. The system of claim 12, wherein limiting the transfer of charge comprises applying a bias voltage to a switch integral to the charge pump, the switch having a bias control configured to cause the switch to operate and be controlled as a current source.

22. The system of claim 21, wherein the bias voltage is configured to be generated from a current mirror.

* * * * *